United States Patent [19]

Yasuda et al.

[11] Patent Number: 5,058,058
[45] Date of Patent: Oct. 15, 1991

[54] STRUCTURE FOR SENSE AMPLIFIER ARRANGEMENT IN SEMICONDUCTOR MEMORY DEVICE

[75] Inventors: Kenichi Yasuda; Kazutami Arimoto, both of Hyogo, Japan

[73] Assignee: Mitsubishi Denki Kabushiki Kaisha, Tokyo, Japan

[21] Appl. No.: 446,366

[22] Filed: Dec. 5, 1989

[30] Foreign Application Priority Data

Dec. 20, 1988 [JP] Japan ................... 63-322527

[51] Int. Cl.⁵ .............................. G11C 5/06
[52] U.S. Cl. ........................ 365/51; 365/63; 365/154; 365/190; 365/208; 357/68
[58] Field of Search .......... 365/207, 189.01, 189.04, 365/51, 63, 190; 357/68

[56] References Cited

U.S. PATENT DOCUMENTS

| | | | |
|---|---|---|---|
| 4,476,547 | 10/1984 | Miyasaka . | |
| 4,546,457 | 10/1985 | Nozaki et al. | 365/207 |
| 4,596,001 | 6/1986 | Baba | 365/207 |
| 4,694,428 | 9/1987 | Matsumura et al. | 365/207 |
| 4,903,344 | 2/1990 | Inoue | 365/207 |
| 4,920,517 | 4/1990 | Yamauchi et al. | 365/207 |
| 4,922,459 | 5/1990 | Hioaka | 365/63 |

FOREIGN PATENT DOCUMENTS

| | | |
|---|---|---|
| 61-227292 | 10/1986 | Japan . |
| 64-64352 | 3/1989 | Japan ........... 365/207 |

OTHER PUBLICATIONS

LSI Technology & Application, by Ohm-Sha, "A Separate Volume of 'Electronics' March", Mar. 5, 1986, pp. 21–26.

NTT articles, Matsumura et al., "Pseudo Folded Bit Line Structure", pp. 498, 499.

Primary Examiner—Joseph E. Clawson, Jr.
Attorney, Agent, or Firm—Lowe, Price, Leblanc and Becker

[57] ABSTRACT

A plurality of sense amplifiers (SAj), each of which is connected with each bit line pair extending from a memory cell array region of a dynamic random access memory for sensing and amplifying voltage difference between the bit line pair, are arranged along the longitudinal direction of the bit line pairs. Each bit line pair is formed by a first bit line (BLj) and a second bit line ($\overline{BLj}$). A plurality of memory cells (Mij) are arranged on intersection points between some of the bit lines (BLj, $\overline{BLj}$) and word lines (WLi), thereby to form the memory cell array region. At least the first bit line (BLj) or the second bit line ($\overline{BLj}$) forming each bit line pair connected to each sense amplifier (SAj) is adapted to intersect with other sense amplifier(s) (SAj) provided on the memory cell array region side as viewed from each sense amplifier (SAj). The sense amplifiers can be arranged independently of the spaces between the bit lines. The sense amplifier circuit having desired characteristics can be structured, while the density of the memory cell array can be increased.

18 Claims, 14 Drawing Sheets

STRUCTURE FOR SENSE AMPLIFIER ARRANGEMENT IN SEMICONDUCTOR MEMORY DEVICE

BACKGROUND OF THE INVENTION

1. Field of the Invention

The present invention generally relates to structures for sense amplifier arrangement in semiconductor memory devices, and more particularly, it relates to structures for arranging sense amplifiers and bit line pairs in semiconductor memory devices.

2. Description of the Prior Art

FIG. 12 is a block diagram showing exemplary structure of a conventional dynamic random access memory (hereinafter referred to as "DRAM") which is well known in the art. Referring to FIG. 12, this DRAM includes a memory cell array 508 which comprises a matrix of a plurality of memory cells for storing data signals, an address buffer 504 which receives address signals for selecting the memory cells, a row decoder 505 and a column decoder 506 for decoding the address signals, and sense amplifier means 603 which is connected to the memory cell array 508 for amplifying and reading the signals stored in the memory cells. An input buffer 509 and an output buffer 600 for inputting and outputting the data signals respectively are connected to the memory cell array 508 through an I/O gate 507.

The address buffer 504 is connected to receive external address signals ext.A0 to ext.A9 or internal address signals Q0 to Q8 which are generated by a refresh counter 503. A refresh controller 502 drives the refresh counter 503 in response to timings of $\overline{RAS}$ and $\overline{CAS}$ signals supplied to a clock generator 501.

FIG. 13A is a circuit diagram showing peripheral circuits of the memory cell array 508 provided in the DRAM shown in FIG. 12. FIG. 13B is a timing chart for illustrating the operation thereof. These are disclosed in pp. 21 to 26 of a separate volume of "Electronics" March, issued by OHM-SHA on Mar. 5, 1986.

Referring to FIG. 13A, memory cells Mij are arranged and connected on intersection points between bit lines BLj and word lines WLi in a memory cell matrix 508a. Each memory cell Mij includes a capacitor Cs for storing a data signal and an N-channel MOS transistor Trs for switching. Each sense amplifier 603 includes a cross-coupling type sense amplifier which is connected between each pair of bit lines BLj and $\overline{BLj}$. This sense amplifier 603 includes an N-channel sense amplifier which is formed by a pair of N-channel MOS transistors Tr1j and Tr2j. This N-channel sense amplifier is connected to the ground through an N-channel MOS transistor Tr3. The N-channel MOS transistor Tr3 has a gate which is connected to receive a sense trigger signal $\phi SE$.

Read/write operation of the DRAM is now described with reference to FIGS. 13A and 13B.

The principle of operation of this DRAM is that, when no memory cell is accessed, $\phi P$ is at a high potential and both the bit lines BLj and $\overline{BLj}$ are equally held at high potentials ($V_{CC}$), while each dummy cell 508b is maintained at the ground potential. After the potential of $\phi P$ is lowered, that at a word line WLi selected by the row address decoder 505 is increased so that data of the selected memory cell is read on the bit line BLj. In more concrete terms, the potential at the bit line BLj is unchanged if the data of the memory cell is a high potential, while electric charge flows from the bit line BLj into the memory cell so that the potential at the bit line BLj is slightly reduced when the data is a low potential. On the other hand, the potential at a dummy word line $\overline{DW}$ of the opposite bit line $\overline{BLj}$ is increased simultaneously with that at the word line WLi, so that data of the corresponding dummy cell 508b is read on the bit line $\overline{BLj}$. In the dummy cell 508b, the ground potential is incorporated in a capacitor which is about half the memory cell size, and hence the potential at the bit line $\overline{BLj}$ is necessarily slightly reduced by an amount about half that in the case of reading a memory cell of a low potential.

Consequently, slight potential difference is caused between the bit lines BLj and $\overline{BLj}$ in this stage, such that the potential at the bit line BLj on the memory cell side is higher if the data of the memory cell is a high potential, while that of the bit line $\overline{BLj}$ on the dummy cell 508b side is higher if the data of the memory cell is a low potential. The potential difference between the bit lines BLj and $\overline{BLj}$ is small because parasitic capacitance is increased since a large number of memory cells are connected to one bit line. Then, the potential of $\phi SE$ is increased to drive the sense amplifier 603, thereby to enlarge the potential difference. The potential at the lower side bit line can be reduced to the ground level while maintaining the potential at the higher side bit line substantially unchanged. Further, an active pullup circuit 601 is driven to raise up the higher side bit line, the potential of which is slightly reduced, to a sufficiently high potential level. Thus, the high or low potential initially set in the memory cell is reproduced on the bit line which is connected to the memory cell.

Then, when the potential of a column select line CSLj selected by the column address decoder 506 is increased, the data of the selected memory cell can be read out since the bit line is connected with I/O and $\overline{I/O}$ lines, while data reproduced and amplified on the bit line can be again stored in the same memory cell when the potential of the word line is reduced in an unselected bit line. Data writing operation is performed in a simpler manner such that potentials at the word line and the column select line CSLj belonging to a memory cell selected by the row address decoder 505 and the column address decoder 506 are increased and the potential of writing data is applied to the bit lines BLj and $\overline{BLj}$ from the I/O and $\overline{I/O}$ lines, and thereafter the potential at the word line WLi is reduced to incorporate the data in the memory cell.

In the DRAM of the aforementioned structure, it has become increasingly difficult to match the arrangement space between the sense amplifiers with that between the memory cells which are connected in response to the sense amplifiers due to high densification of the memory cell array. The memory cell array of a conventional DRAM is generally provided in open bit line structure or folded bit line structure, depending on arrangement of bit line pairs which are connected to sense amplifiers.

FIG. 14 is a plan view conceptually showing the open bit line structure as an exemplary layout system of bit lines in a DRAM. Referring to FIG. 14, each sense amplifier SAj is connected with a pair of bit lines BLj and $\overline{BLj}$, which are opposed to each other through the sense amplifier SAj. According to this open bit line structure, memory cells Mij are arranged one by one on intersection points between word lines WLi and the bit lines BLj and $\overline{BLj}$. Thus, the open bit line structure is suitable for densification of the memory cells in view of layout efficiency. However, since each amplifier SAj is arranged in correspondence to each bit line, the arrangement space (pitch) between the sense amplifiers is influenced by the bit line space. It is impossible to relax the sense amplifier pitch since each sense amplifier is arranged within one memory cell pitch, and hence the open bit line structure is disadvantageous in view of design layout of the sense amplifiers.

FIG. 15 is a plan view conceptually showing the folded bit line structure as an exemplary layout system of bit lines in a DRAM. Referring to FIG. 15, each sense amplifier SAj is connected with a pair of bit lines BLj and $\overline{BLj}$, which are arranged in parallel with each other. According to this folded bit line structure, two bit lines forming each bit line pair are close to each other to be substantially uninfluenced by dispersion caused in working, electrical noise or the like. Thus, this structure is advantageous in view of balance of the bit lines and sensitivity of the sense amplifiers as compared with the open bit line structure shown in FIG. 14. According to the folded bit line structure, further, each bit line pair formed by two adjacent bit lines is arranged in a memory cell array which is provided on one side of each sense amplifier, and hence the arrangement space (pitch) between the sense amplifiers can be relaxed from one memory cell pitch to two memory cell pitches. Thus, the folded bit line structure is relatively advantageous in design layout of the sense amplifiers as compared with the open bit line structure. According to this folded bit line structure, however, it is impossible to arrange memory cells Mij on all intersection points between word lines WLi and the bit lines BLj and $\overline{BLj}$ due to restriction in design layout. More specifically, memory cells are arranged at every other intersection of the word line and the bit line. Therefore, densification of the memory cell array, i.e., area reduction of the memory cell array region cannot be sufficiently attained.

There has been proposed a technique called pseudo folded bit line structure, as a bit line layout system which can reduce the area of the memory cell array region and relax the sense amplifier pitch. Such pseudo folded bit line structure is disclosed in U.S. Pat. No. 4,476,547 and Denshi Tsushin Gakkai Sogo Zenkoku Taikai Koen Ronbun-shu Bunsatsu 2, 1986, pp. 256-257, for example.

FIG. 16 is a plan view conceptually showing the pseudo folded bit line structure. According to this pseudo folded bit line structure, memory cells Mij are arranged on intersection points between pairs of bit lines BLj and $\overline{BLj}$ and word lines WLi, similarly to the open bit line structure. The memory cell array is divided into a plurality of subarrays along the word line direction, as shown by dotted lines in FIG. 16. In the example shown in FIG. 16, each subarray includes four memory cells in the word line direction. The memory cells included in each subarray deviate by half the memory cell pitch from those in the adjacent subarray. Similarly to the folded bit line structure, two bit lines are connected to one side of each sense amplifier to form a bit line pair. However, this structure is different from the folded bit line structure in the point that each bit line pair is formed by two bit lines which belong to different subarrays. Referring to FIG. 16, each subarray is formed by four bit lines. The bit lines $\overline{BL1}$ to $\overline{BL4}$ belonging to the upper subarray are connected to the sense amplifiers SA1 to SA4 respectively. The bit lines BL1 to BL4 belonging to the lower subarray are also connected to the sense amplifiers SA1 to SA4 respectively. Thus, each sense amplifier is connected with two bit lines, which belong to different subarrays. According to this structure, the sense amplifier pitch can be relaxed to two memory cell pitches similarly to the folded bit line structure, while the density of the memory cell array can be improved to a high level which is substantially equal to that of the open bit line structure.

However, in any bit line layout system of the generally proposed open bit line structure, folded bit line structure and pseudo folded bit line structure, arrangement of the sense amplifiers is restricted by the space between the bit lines, i.e., the memory cell pitch. Even if the folded bit line structure or the pseudo folded bit line structure is employed, the space between adjacent sense amplifiers cannot be relaxed in excess of two memory cell pitches. Therefore, it has been difficult to design a sense amplifier circuit responsive to desired characteristics of peripheral circuits which are connected to the sense amplifiers with no restriction by the layout of the memory cell array region. Further, the conventional sense amplifiers are arranged one by one in the longitudinal direction of the bit lines in response to the spaces between the bit lines forming the memory cell array, and hence it has been difficult to reduce the plane area of the region provided with the sense amplifier circuit.

FIG. 17 is a plan view conceptually showing arrangement of sense amplifiers in a prior art example disclosed in Japanese Patent Laying-Open No. 61-227292/(1986). According to this structure, a plurality of sense amplifiers are arranged in the longitudinal direction of bit lines. However, as the regions provided with the sense amplifiers are separated from the memory cell array region, spaces between the bit lines which are connected with the sense amplifiers are increased. Therefore, bit line pairs connected with different sense amplifiers cannot be identically spaced apart and hence it is impossible to form all bit line pairs by bit lines which are close to each other. Thus, the bit line structure shown in FIG. 17 is easily influenced by electrical noise etc. Further, interconnection regions required for forming the bit lines to be connected with the sense amplifiers are increased.

SUMMARY OF THE INVENTION

An object of the present invention is to provide a semiconductor memory device which has sense amplifiers arranged independently of spaces between bit lines.

Another object of the present invention is to provide a semiconductor memory device which can form a sense amplifier circuit responsive to desired characteristics of peripheral circuits connected to sense amplifiers with no influence by spaces between bit lines.

Still another object of the present invention is to provide a semiconductor memory device which can reduce the plane area occupied by a region provided with sense amplifiers.

A further object of the present invention is to provide a semiconductor memory device having structure of sense amplifier arrangement which is suitable for noise reduction in sensing of bit line pairs being close to each other.

A further object of the present invention is to provide a semiconductor memory device which can relax the sense amplifier pitch without crossing separated bit lines with each other.

A further object of the present invention is to provide a dynamic random access memory which can reduce the area of a part provided with sense amplifiers independently of the bit line space or the memory cell pitch.

A still further object of the present invention is to eliminate intersection portions of bit lines in connection of the bit line and sense amplifier.

A semiconductor memory device according to the present invention comprises a semiconductor substrate, a plurality of bit line, a plurality of word lines, a memory cell array region and sense amplifiers. The plurality of bit line pairs and the plurality of word lines intersect with each other on the major surface of the semiconductor substrate. Each bit line pair is formed by a first bit line and a second bit line. The memory cell array region is formed by a plurality of memory cells which are arranged on intersection points between the bit lines and the word lines. Each of sense amplifiers is connected to each bit line pair extending from the memory cell array region in order to sense and amplify voltage difference between the bit line pair. These sense amplifiers are arranged in plural along the longitudinal direction of the bit lines. At least either the first bit line or the second bit line forming the bit line pair connected to each sense amplifier is arranged to intersect with other sense amplifier(s) provided on the memory cell array region side as viewed from the said each sense amplifier. In other words, at least one bit line of each bit line pair is connected respectively to only a corresponding one of the sense amplifier means, and at least some sense amplifier means are arranged to intersect with at least one bit line of the bit line pairs connected to other ones of the sense amplifier means.

The sense amplifiers include field effect transistors. The field effect transistors are so arranged that the direction of width of gates forming the field effect transistors is across the longitudinal direction of the bit lines.

According to a preferred embodiment of the present invention, each bit line pair may include a first bit line extending from one side surface of each sense amplifier and a second bit line extending from another side surface of the sense amplifier. Or, each bit line pair may include a first bit line and a second bit line, both of which extend from one side of each sense amplifier. Further, the first bit line and the second bit line may include bit lines extending in the same direction with a constant space. The first bit line and the second bit line may include bit lines which are close to each other and extending in the same direction. Such first bit lines and second bit lines may be alternately arranged to form a plurality of bit line pairs. Further, a first bit line group formed by a given number of first bit lines and a second bit line group formed by the same number of second bit lines may be alternately arranged to provide a plurality of bit line pairs. In this case, sense amplifiers are arranged along the longitudinal direction of the bit line pairs in response to the number of the bit line pairs formed by the first bit line group and the second bit line group. At least either the first bit line or the second bit line forming the bit line pair connected to each sense amplifier may intersect with gates forming field effect transistors included in the sense amplifier.

According to the present invention, a plurality of sense amplifiers are arranged along the longitudinal direction of the bit lines. Some of the bit lines connected with the sense amplifiers are adapted to intersect with the sense amplifiers which are not connected with the bit lines. In other words, one sense amplifier circuit can be formed to extend over a plurality of bit line pairs. Therefore, it is not necessary to arrange the sense amplifiers in correspondence to the spaces between the bit line pairs or the bit lines. Thus, the layout of the sense amplifiers can be designed independently of the spaces between the bit lines. Consequently, a sense amplifier circuit having desired characteristics in response to peripheral circuits which are connected to the sense amplifiers can be designed with no influence by the spaces between the bit lines, i.e., the memory cell pitch in the memory cell array region.

Further, the plane area occupied by the sense amplifier circuit can be reduced by designing the layout of the sense amplifier circuit so that the direction of width of gates forming field effect transistors included in the sense amplifiers is across the longitudinal direction of the bit lines.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
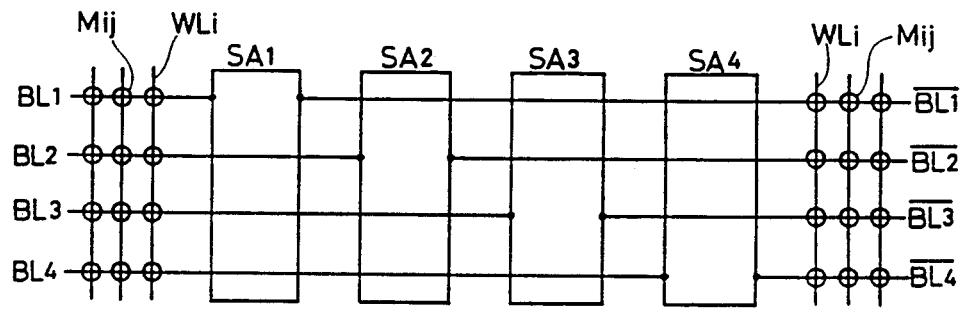
FIG. 1 is a plan view conceptually showing the layout of sense amplifier arrangement according to the present invention, which is applied to open bit line structure.

FIG. 1 is a plan view conceptually showing the layout of sense amplifier arrangement according to the present invention, which is applied to the open bit line structure. Referring to FIG. 1, four sense amplifiers SA1, SA2, SA3 and SA4 are arranged along the longitudinal direction of bit lines. Memory cell array regions are provided on both sides of the four sense amplifiers. Memory cells Mij are arranged one by one on respective intersection points between bit lines BLj and $\overline{BLj}$ and word lines WLi. Noting the sense amplifier SA1, the bit line BL1 is directly connected to the sense amplifier SA1 from the memory cell array region, while the bit line $\overline{BL1}$ extends across the sense amplifiers SA4, SA3 and SA2, to be connected to the sense amplifier SA1. Noting the sense amplifier SA2, the bit line BL2 extends across the sense amplifier SA1 to be connected to the sense amplifier SA2, while the bit line $\overline{BL2}$ extends across the sense amplifiers SA4 and SA3, to be connected to the sense amplifier SA2. The bit lines BL3, $\overline{BL3}$, BL4 and $\overline{BL4}$ are similarly connected to the sense amplifiers SA3 and SA4 respectively.

Figure 2:
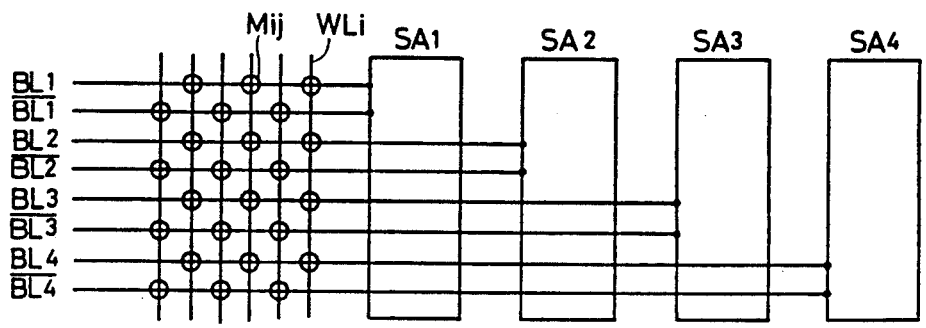
FIG. 2 is a plan view conceptually showing the layout of sense amplifier arrangement according to the present invention, which is applied to folded bit line structure.

FIG. 2 is a plan view conceptually showing the layout of sense amplifier arrangement according to the present invention, which is applied to the folded bit line structure. Referring to FIG. 2, four sense amplifiers SA1, SA2, SA3 and SA4 are arranged along the longitudinal direction of bit lines. Memory cells Mij are alternately arranged on intersection points between bit lines BLj and $\overline{BLj}$ and word lines WLi, with restriction in layout such as processing of passing word lines. The bit lines extending from a memory cell array region are connected to single sides of the respective sense amplifiers SA1, SA2, SA3 and SA4. Noting the sense amplifier SA1, a pair of bit lines BL1 and $\overline{BL1}$ extending from the memory cell array region are connected to the sense amplifier SA1. A pair of bit lines BL2 and $\overline{BL2}$ extend across the sense amplifier SA1, to be connected to the sense amplifier SA2. A pair of bit lines BL3 and $\overline{BL3}$ extend across the sense amplifiers SA1 and SA2, to be connected to the sense amplifier SA3. A pair of bit lines BL4 and $\overline{BL4}$ extend across the sense amplifiers SA1, SA2 and SA3, to be connected to the sense amplifier SA4.

Figure 3:
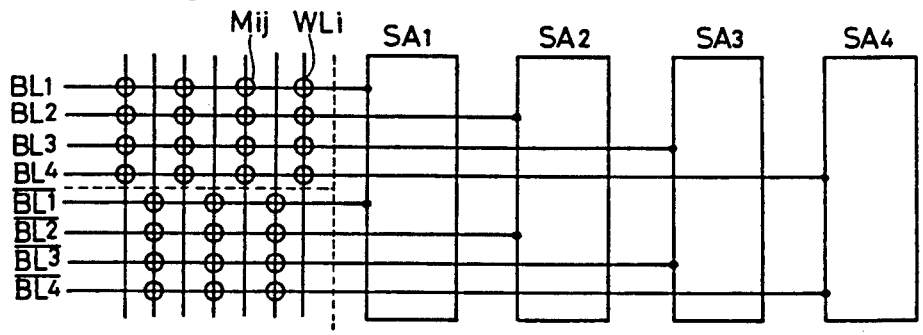
FIG. 3 is a plan view conceptually showing the layout of sense amplifier arrangement according to the present invention, which is applied to pseudo folded bit line structure.

FIG. 3 is a plan view conceptually showing the layout of sense amplifier arrangement according to the present invention, which is applied to the pseudo folded bit line structure. Referring to FIG. 3, four sense amplifiers SA1, SA2, SA3 and SA4 are arranged along the longitudinal direction of bit lines. The bit lines are connected to single sides of the sense amplifiers SA1 to SA4. Each bit line pair is formed by two bit lines extending from different subarrays, which are separated by dotted lines in FIG. 3, to be connected to each sense amplifier. Memory cells Mij are arranged on intersection points between word lines WLi and bit lines BLj and $\overline{BLj}$ in each subarray, while deviating by half the memory cell pitch from those in the adjacent subarray. Noting the sense amplifier SA1, the bit lines BL1 and $\overline{BL1}$ extend from the memory cell array region, to be connected to the sense amplifier SA1. The bit lines BL2 and $\overline{BL2}$ extend across the sense amplifier SA1, to be connected to the sense amplifier SA2. The bit lines BL3 and $\overline{BL3}$ extend across the sense amplifiers SA1 and SA2, to be connected to the sense amplifier SA3. The bit lines BL4 and $\overline{BL4}$ extend across the sense amplifiers SA1, SA2 and SA3, to be connected to the sense amplifier SA4. Thus, the respective bit line pairs which are connected to the respective sense amplifiers are identically spaced apart from each other.

As shown in FIG. 1, 2 or 3, the sense amplifiers are arranged along the longitudinal direction of the bit lines while the bit lines connected to each sense amplifier extend across other sense amplifier(s), whereby the sense amplifiers can be arranged independently of the bit line space. Although the sense amplifier pitch along the word lines corresponds to four memory cell pitches in the example shown in FIG. 1, 2 or 3 since four sense amplifiers are arranged along the longitudinal direction of the bit lines, the present invention is not restricted to this. In other words, the number of sense amplifiers arranged along the longitudinal direction of bit lines depends on the overall layout design, and the sense amplifier pitch along the word lines is irrelevant to the memory cell pitch. Thus, the layout of the sense amplifier circuit can be designed in response to desired characteristics of peripheral circuits connected thereto, independently of the memory cell pitch.

Figure 16:
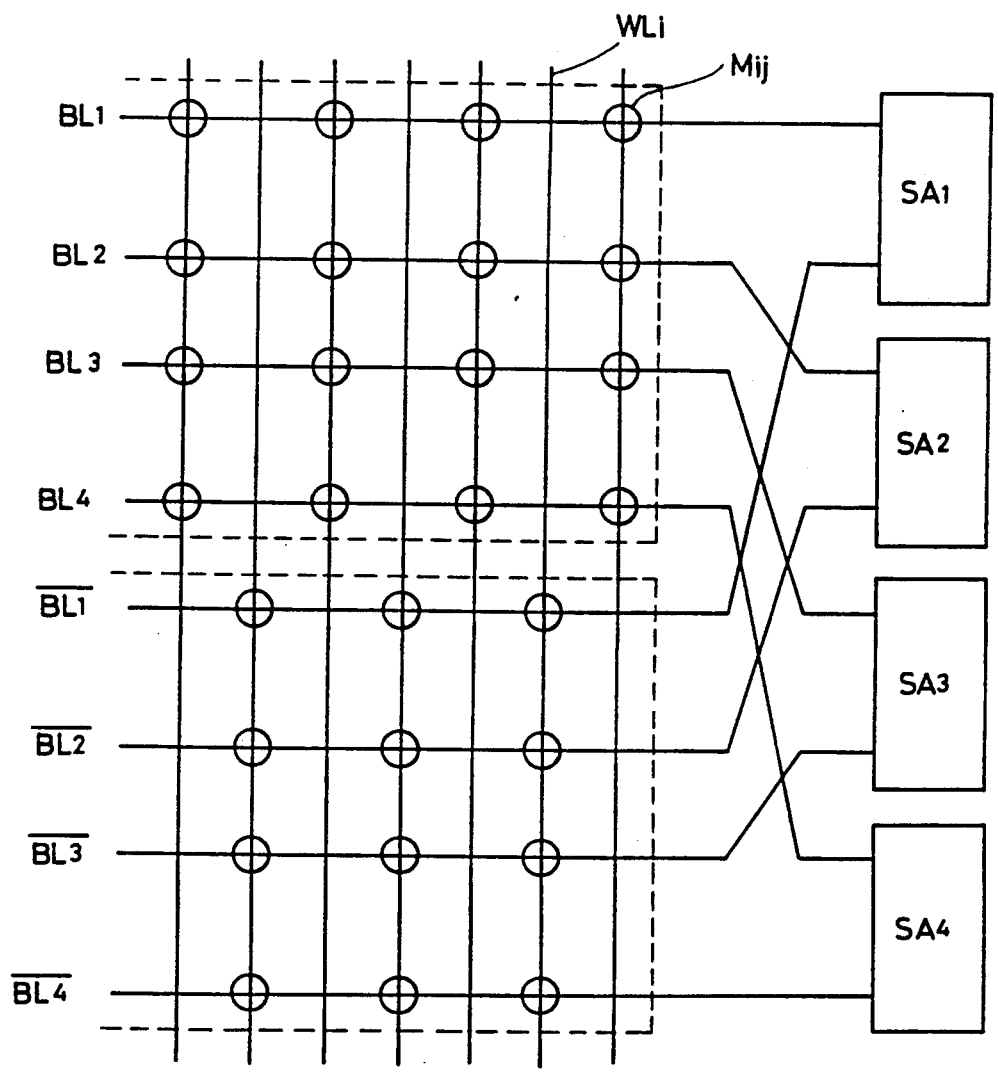
FIG. 16 is a plan view conceptually showing conventional pseudo folded bit line structure.
Figure 17:
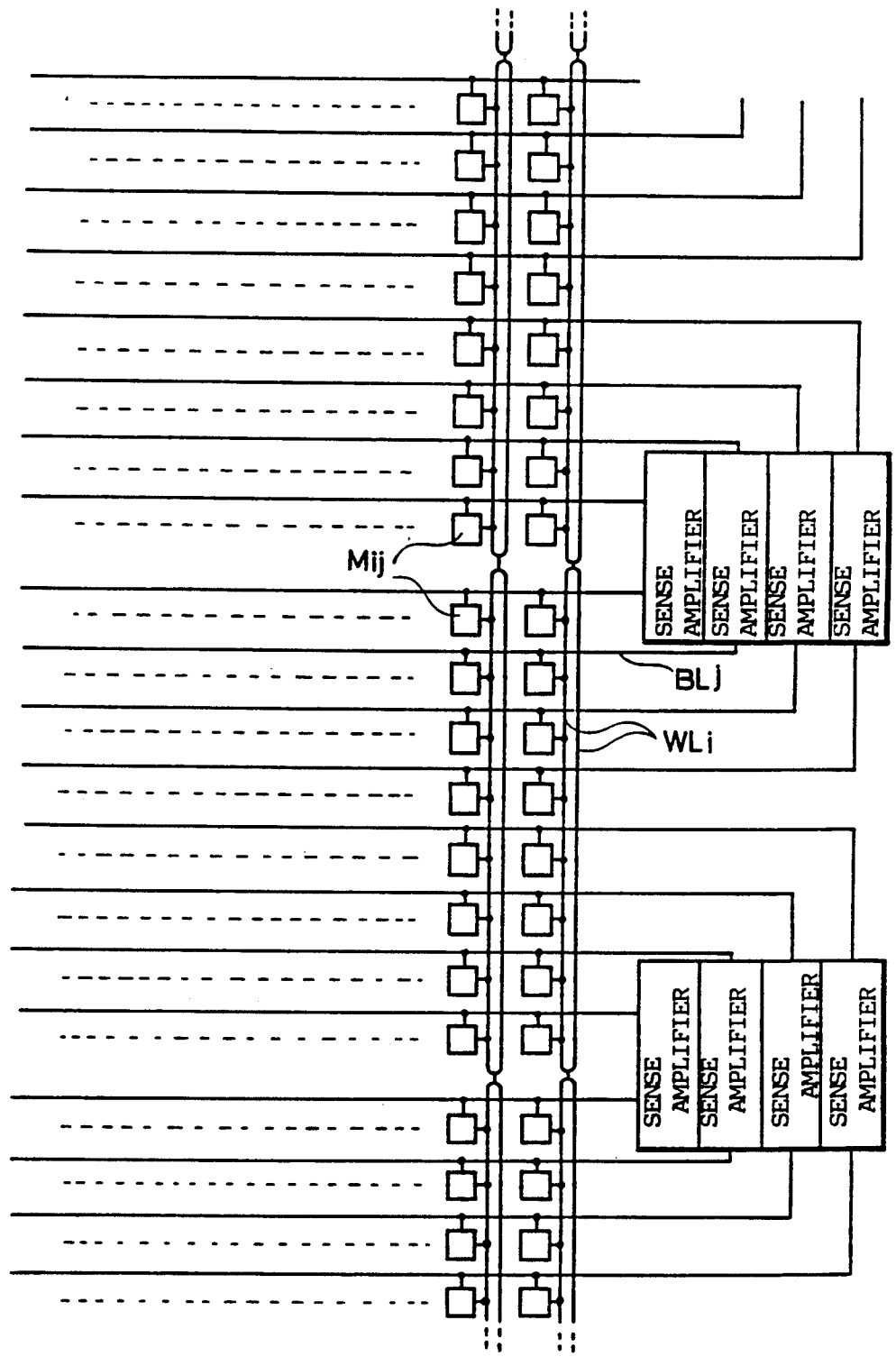
FIG. 17 is a plan view conceptually showing arrangement of sense amplifiers in a prior art example.

According to the layout applied to the pseudo folded bit line structure shown in FIG. 3, two bit lines which are separated from each other can be connected to a sense amplifier to form a bit line pair with no intersection, unlike the layout of the conventional pseudo folded bit line structure which shown in FIG. 16. Thus, the arrangement of the bit lines can be simplified and the areas required for intersections between the bit lines can be reduced.

Figure 4:
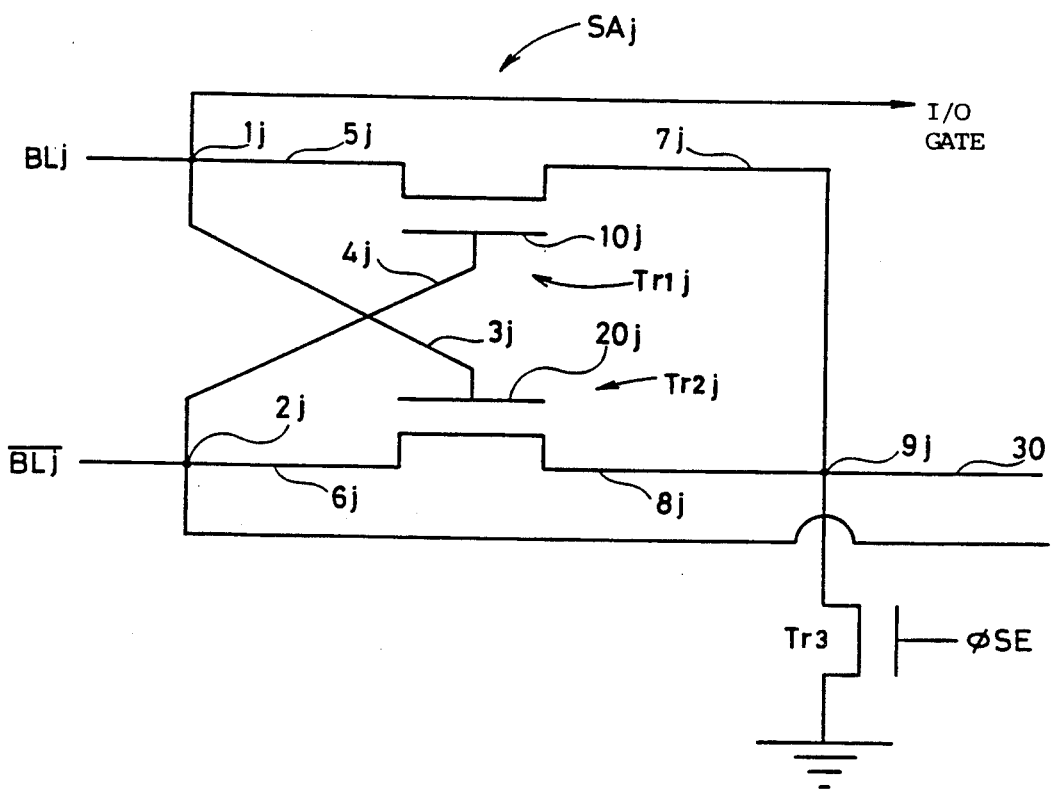
FIG. 4 is a circuit diagram showing an equivalent circuit of an exemplary sense amplifier employed in the present invention.

FIG. 4 is a circuit diagram showing an exemplary FIG. 1, 2 or 3. According to this example, the sense amplifier SAj includes a cross-coupling type sense amplifier which is connected between bit lines BLj and $\overline{BLj}$. This sense amplifier includes an N-channel sense amplifier which is formed by N-channel MOS transistors Tr1j and Tr2j. This sense amplifier is connected to the ground through an N-channel MOS transistor TR3, which has a gate connected to receive a sense trigger signal $\phi$SE.

Figure 5:
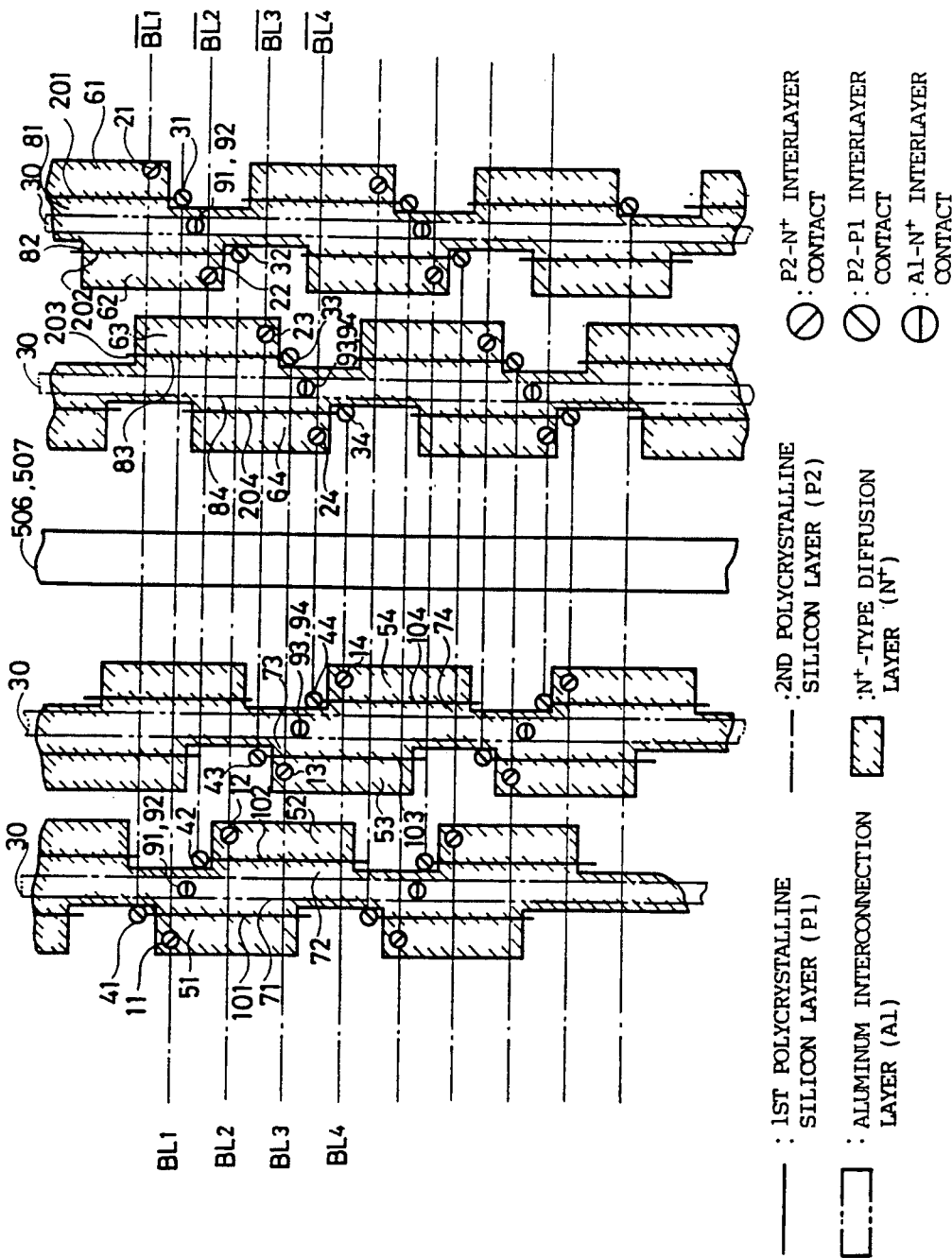
FIGS. 5 and 6 are plan views showing exemplary planar structure of sense amplifiers applied to the open bit line structure shown in FIG. 1.
Figure 6:
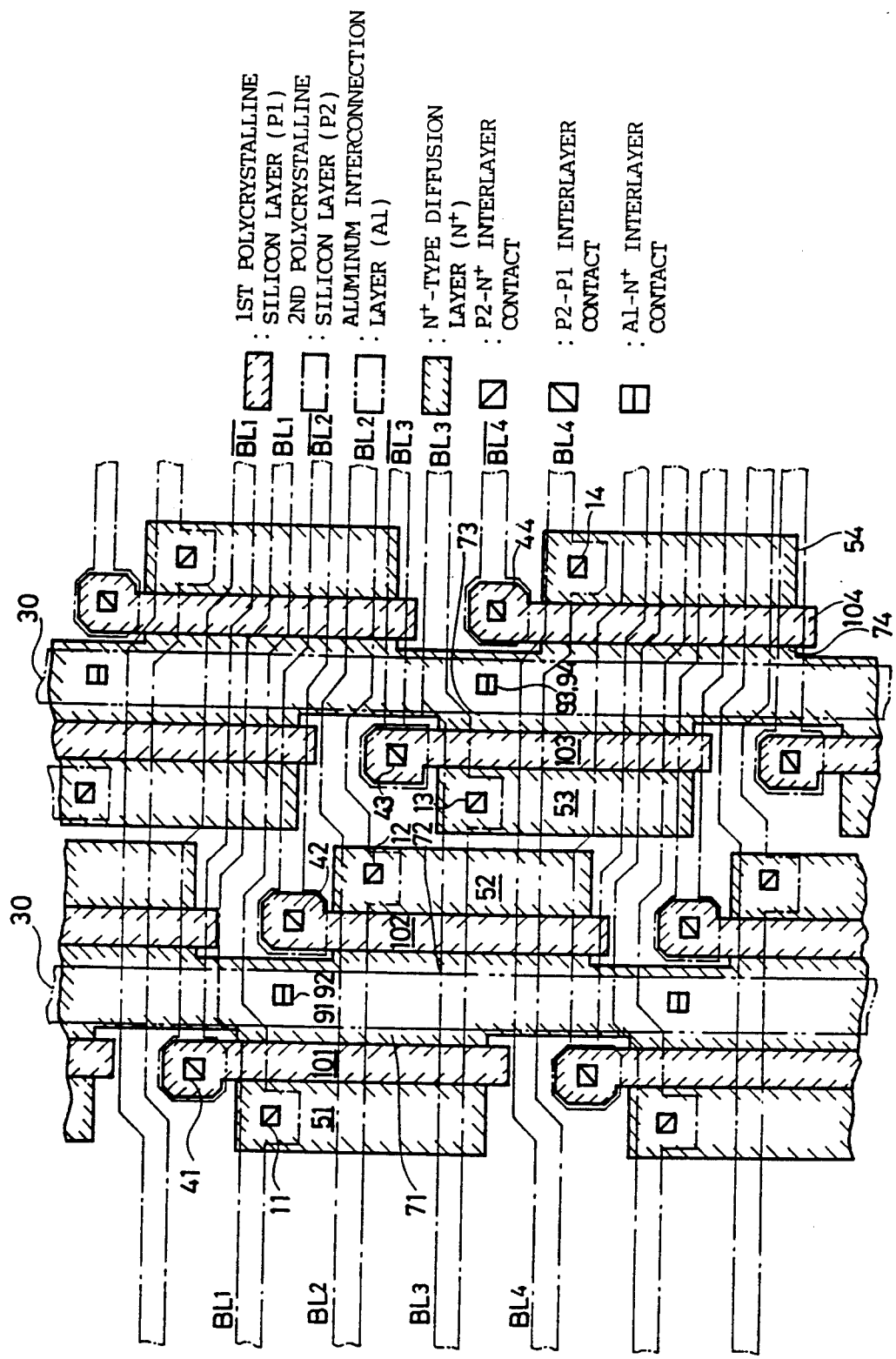
Figure 7:
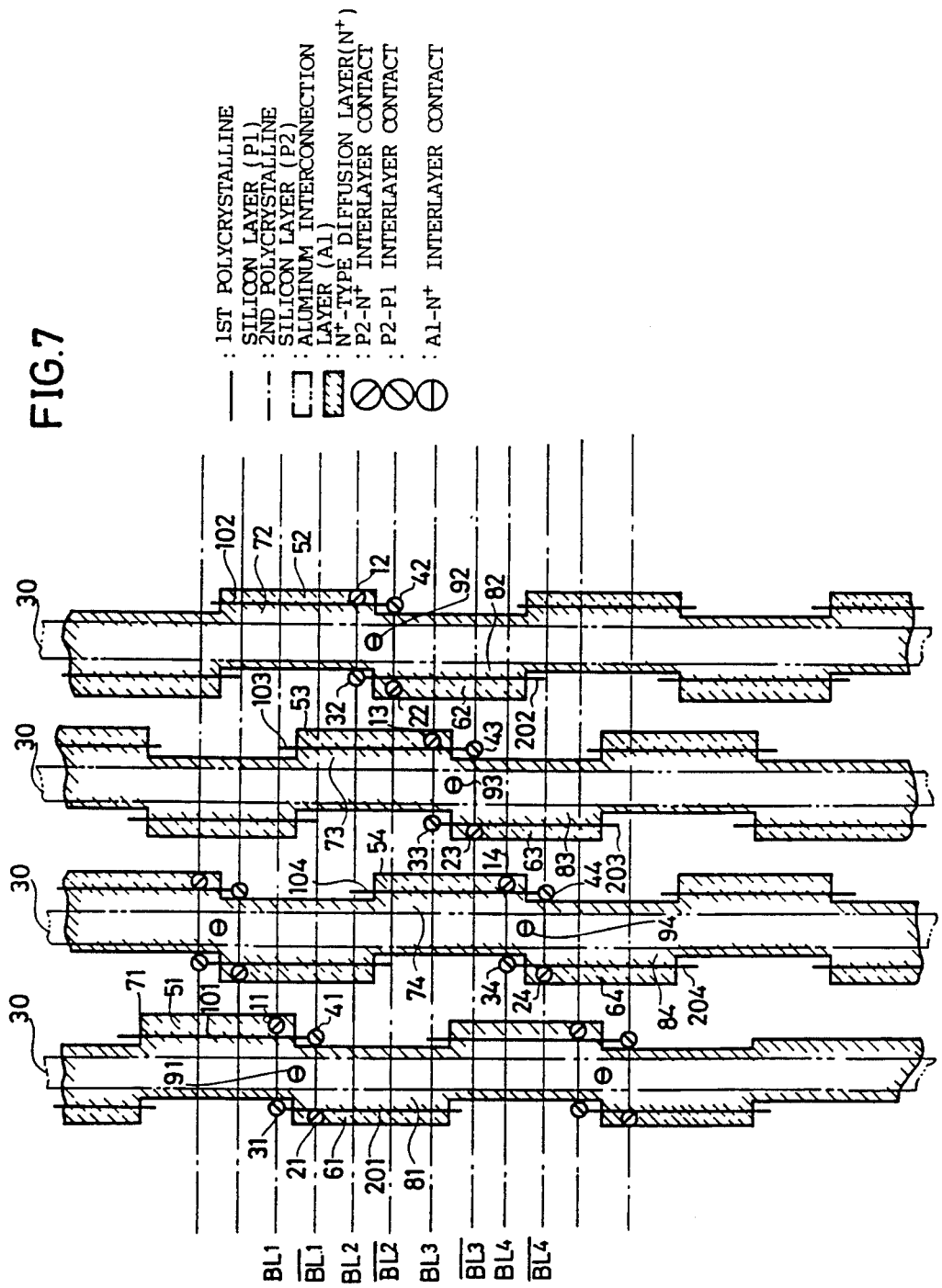
FIGS. 7 and 8 are plan views showing exemplary planar structure of sense amplifiers applied to the folded bit line structure shown in FIG. 2.
Figure 8:
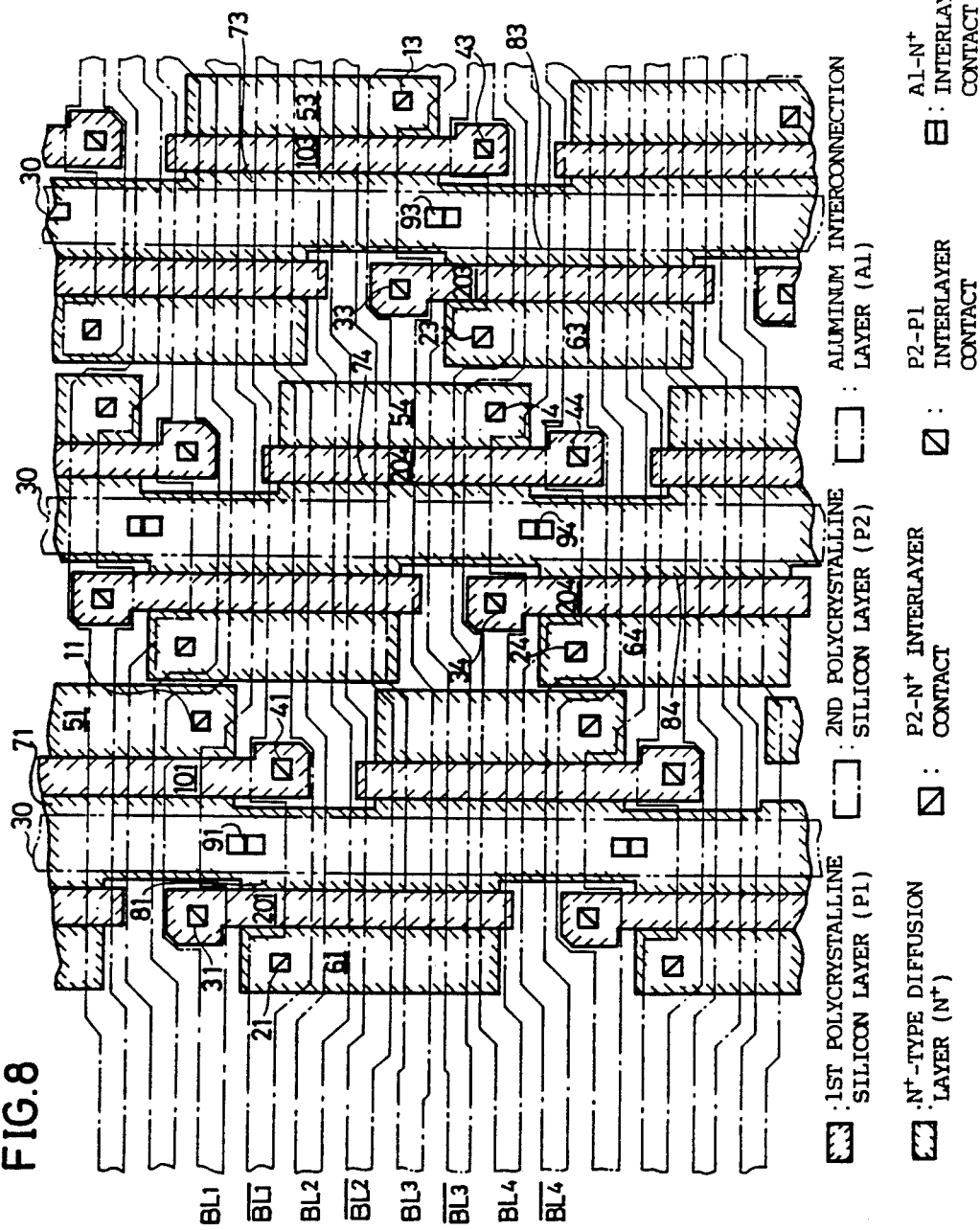
Figure 9:
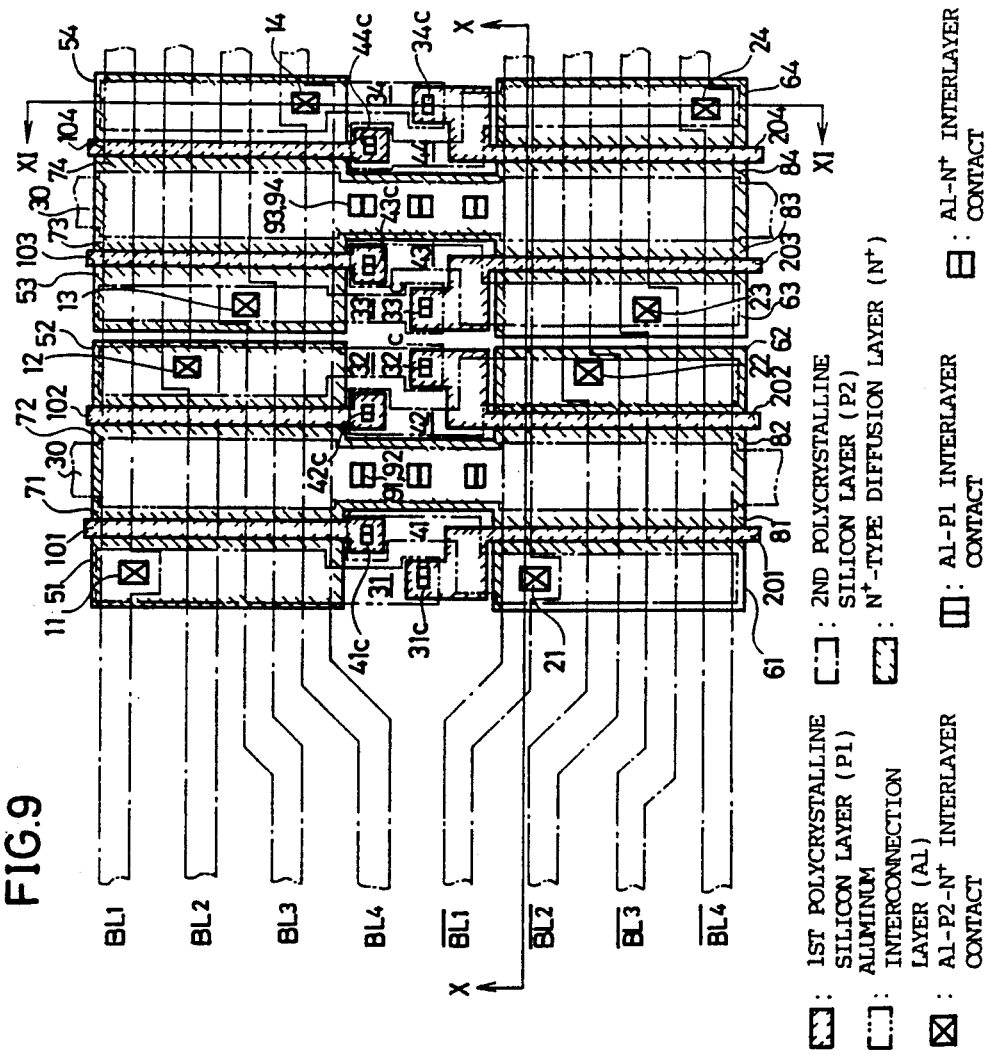
FIG. 9 is a plan view showing exemplary planar structure of a sense amplifier applied to the pseudo folded bit line structure shown in FIG. 3.
Figure 10:
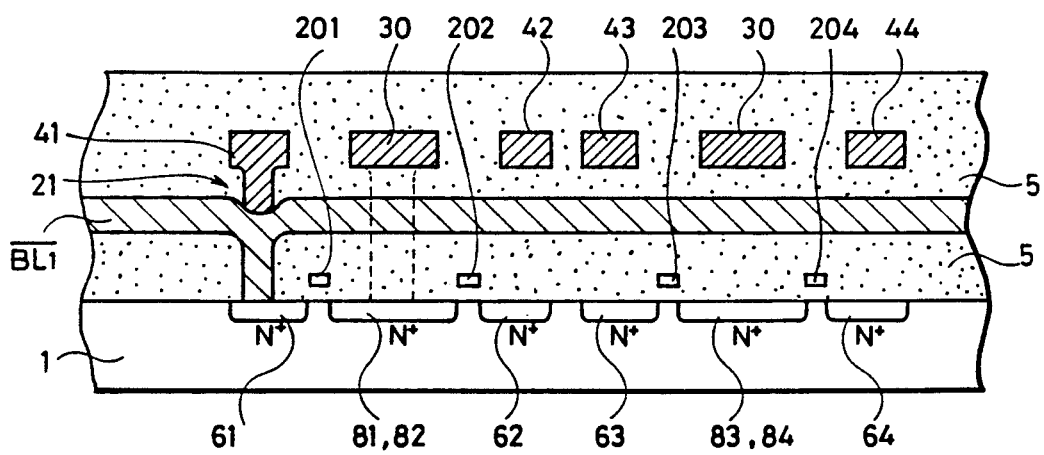
FIG. 10 is a sectional view taken along the line X—X in FIG. 9.
Figure 11:
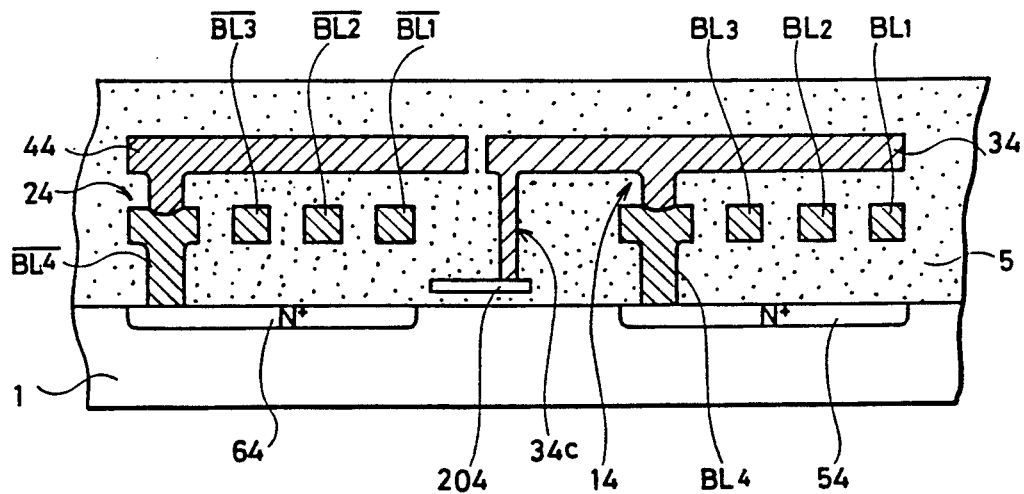
FIG. 11 is a sectional view taken along the line XI—XI in FIG. 9.
Figure 12:
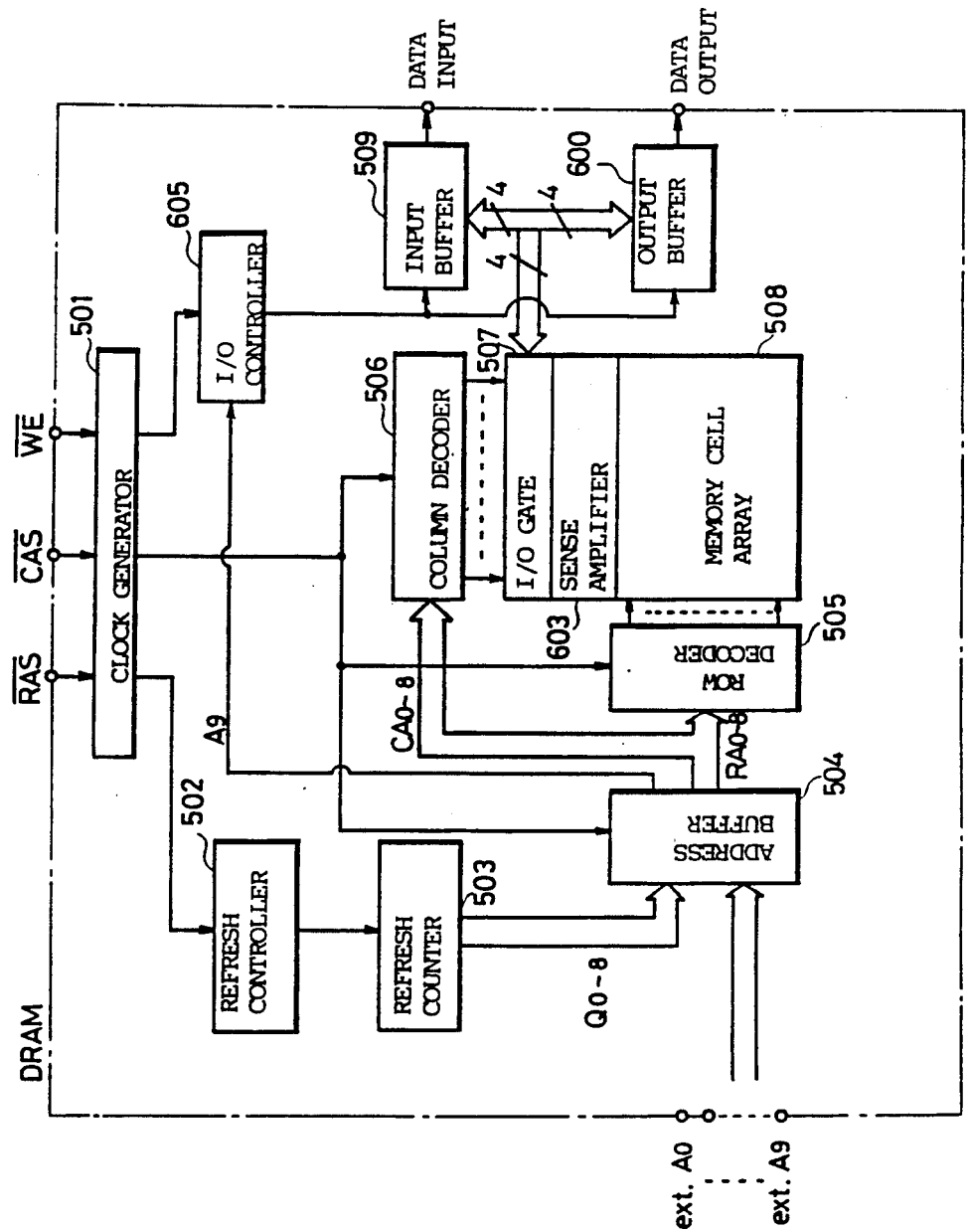
FIG. 12 is a block diagram showing exemplary structure of a conventional DRAM.
Figure 13A:
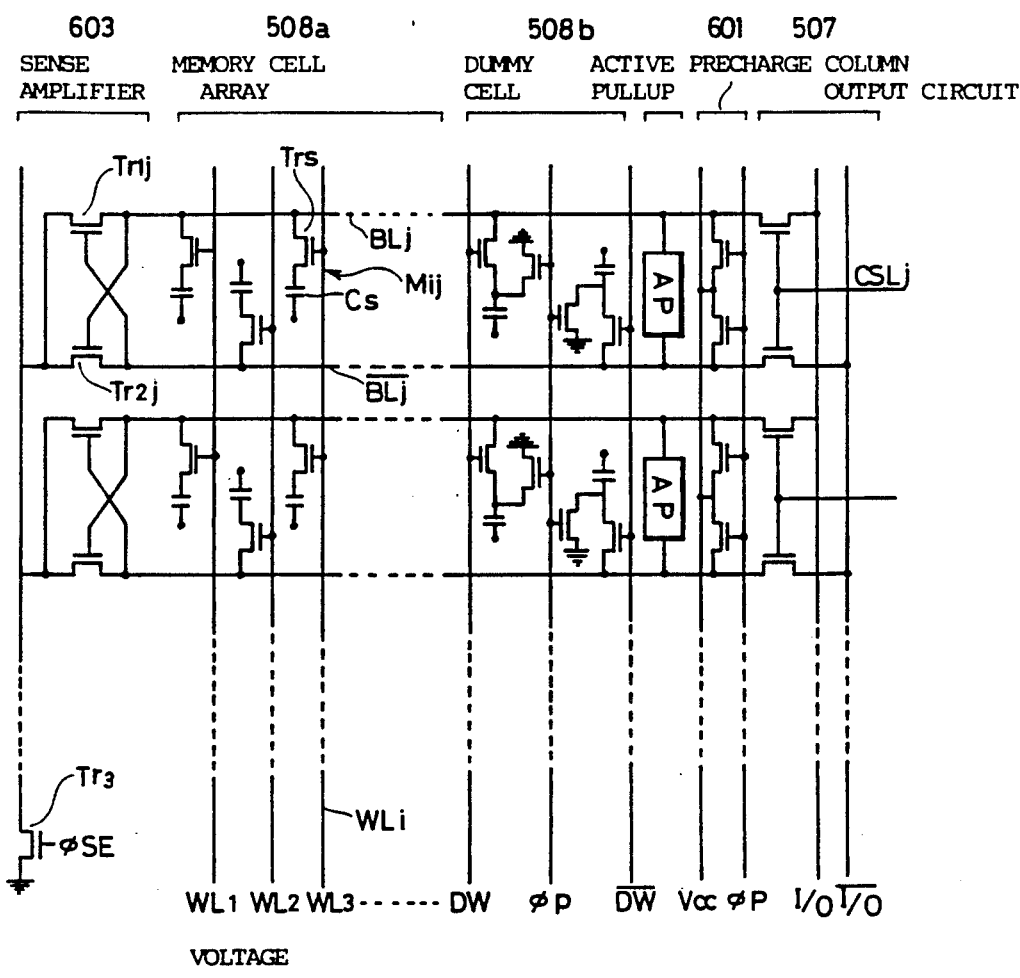
FIG. 13A is a circuit diagram showing conventional peripheral circuits which are connected to bit line pairs.
Figure 13B:
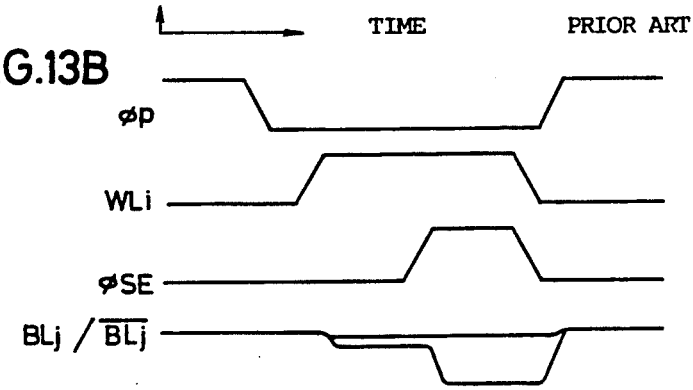
FIG. 13B is a timing chart for illustrating the operation of the circuits shown in FIG. 13A.
Figure 14:
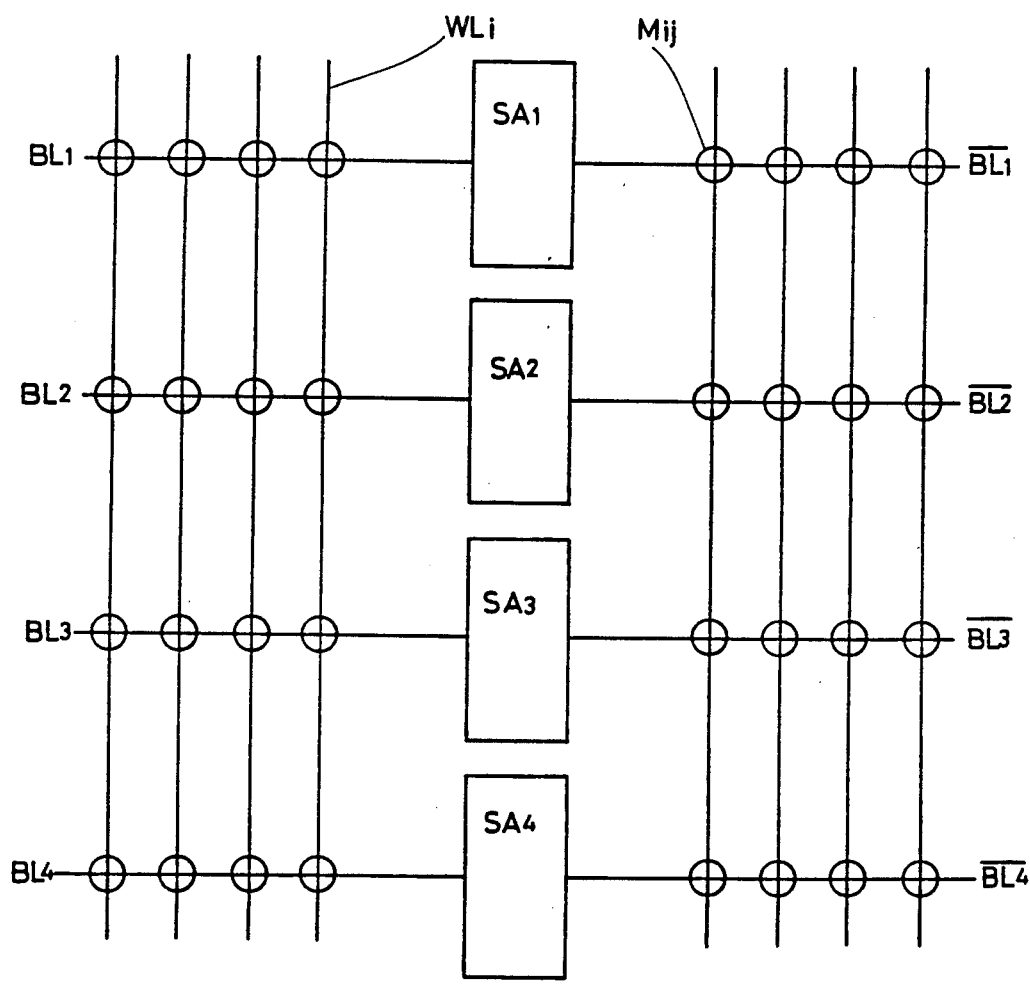
FIG. 14 is a plan view conceptually showing conventional open bit line structure.
Figure 15:
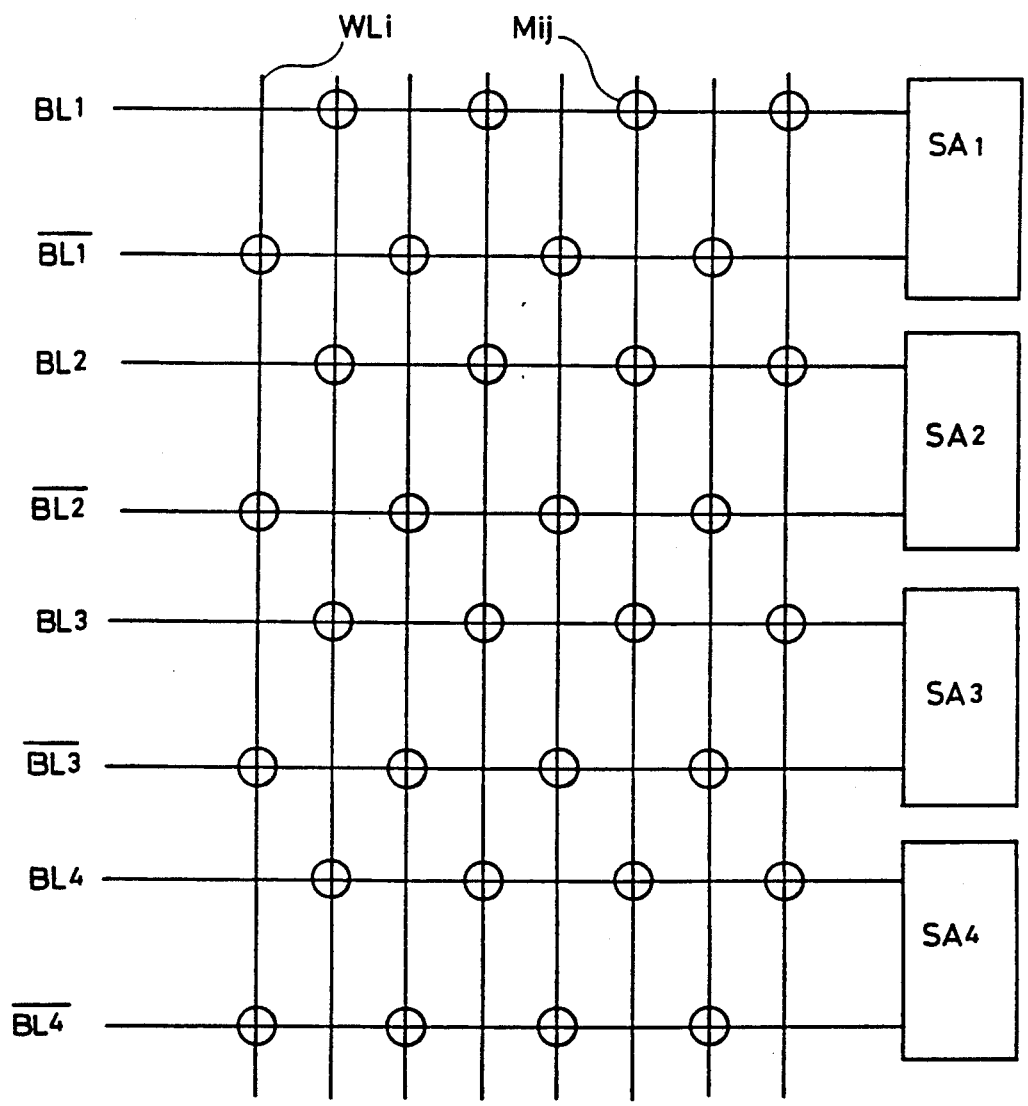
FIG. 15 is a plan view conceptually showing conventional folded bit line structure.

The following description is made on examples of concrete planar structure of sense amplifiers provided in layout formed by the sense amplifiers and bit lines shown in FIGS. 1, 2 and 3 through the N-channel sense amplifiers shown in FIG. 4. FIGS. 5 and 6 are plan views showing exemplary planar structure of sense amplifier arrangement according to the present invention, which is applied to the open bit line structure. FIGS. 7 and 8 are plan views showing exemplary planar structure of sense amplifier arrangement according to the present invention, which is applied to the folded bit line structure. FIG. 9 is a plan view showing exemplary planar structure of sense amplifier arrangement according to the present invention, which is applied to the pseudo folded bit line structure. FIG. 10 is a sectional view taken along the line X—X in FIG. 9, and FIG. 11 is a sectional view taken along the line XI—XI in FIG. 9. Throughout FIGS. 5 to 11, reference numerals correspond to those of the N-channel sense amplifier shown in FIG. 4, assuming that j=1, 2, 3, 4. Therefore, the following description is made particularly with reference to four sense amplifiers SA1, SA2, SA3 and SA4 and four pairs of bit lines BL1, $\overline{BL1}$, BL2, $\overline{BL2}$, BL3, $\overline{BL3}$, BL4 and $\overline{BL4}$ in each figure.

Referring to FIGS. 4, 5 and 6, the planar structure of the sense amplifiers and the bit lines arranged according to the present invention, which is applied to the open bit line structure, is now described. The sense amplifier SA1, which is connected with the bit lines BL1 and $\overline{BL1}$, includes two N-channel MOS transistors Tr11 and Tr21. The N-channel MOS transistor Tr11 is formed by N diffusion layers 51 and 71 for serving as source or drain regions and a gate 101 which is provided above the same. The N-channel MOS transistor Tr21 is formed by N+ diffusion layers 61 and 81 for serving as source or drain regions and a gate 201 which is provided above the same. The gates are formed by first polycrystalline silicon layers. The bit line BL1 is connected to the N+ diffusion layer 51 through a contact 11. The bit line BL1 is further connected to the gate 201 through a contact 31. On the other hand, the bit line $\overline{BL1}$ is connected to the N+ diffusion layer 61 through a contact 21. The bit line $\overline{BL1}$ is further connected to the gate 101 through a contact 41. The N+ diffusion layers 71 and 81 are connected to an aluminum interconnection layer 30 through a contact 91.

The sense amplifier SA2, which is connected with the bit lines BL2 and $\overline{BL2}$, includes two N-channel MOS transistors Tr12 and Tr22. The transistor Tr12 is formed by N+ diffusion layers 52 and 72 for serving as source or drain regions and a gate 102 which is provided above the same. The transistor Tr22 is formed by N+ diffusion layers 62 and 82 for serving as source or drain regions and a gate 202 which is provided above the same. The bit line BL2 is connected to the N+ diffusion layer 52 through a contact 12. The bit line BL2 is further connected to the gate 202 through a contact 32. On the other hand, the bit line $\overline{BL2}$ is connected to the N+ diffusion layer 62 through a contact 22. The bit line $\overline{BL2}$ is further connected to the gate 102 through a contact 42.

The sense amplifiers SA3 and SA4, which are connected with the bit line BL3, $\overline{BL3}$, BL4 and $\overline{BL4}$ respectively, are formed similarly to the above.

In the planar structure of the sense amplifiers arranged in such a manner, the direction of width of the gates forming the N-channel MOS transistors included in each sense amplifier is across the longitudinal direction of the bit lines. For example, the bit line BL1 extends across the direction of width of the gate 101, i.e., the channel width direction, as shown in FIGS. 5 and 6. The bit line BL1 further intersects with the gates 202 and 203 forming the sense amplifiers SA2 and SA3, which are not connected with the bit lines BL1, respectively. Thus, the N-channel MOS transistors forming the sense amplifiers are so arranged that the direction of width of the gates forming the sense amplifiers is across the longitudinal direction of the bit lines, thereby to enable reduction of the plane area of the region provided with the sense amplifiers. In other words, each of the N+ diffusion layers forming the N-channel transistors included in the sense amplifiers can be shared by a plurality of N-channel MOS transistors, thereby to enable area reduction of the region provided with the sense amplifiers. This is understood from FIG. 6, in which N+ diffusion layers 71, 72, 73 and 74 are formed as shared N+ diffusion layers.

Referring to FIG. 5, a column decoder 506 and an I/O gate 507 are provided to extend orthogonally to the bit lines. In order to illustrate the structure of FIG. 5 in more detail, FIG. 6 shows only a part on the left side of the column decoder 506 and the I/O gate 507.

With reference to FIGS. 4, 7 and 8, the concrete planar structure of the sense amplifier arrangement according to the present invention, which is applied to the folded bit line structure, is now described. FIG. 8 shows only a part of FIG. 7, in order to illustrate the structure in more detail. The sense amplifier SA1, which is connected with the bit lines BL1 and $\overline{BL1}$, includes N-channel MOS transistors Tr11 and Tr21. The N-channel MOS transistor Tr11 is formed by N+ diffusion layers 51 and 71 for serving as source or drain regions and a gate 101 which is provided above the same. The N-channel MOS transistor Tr21 is formed by N+ diffusion layers 61 and 71 for serving as source or drain regions and a gate 201 which is provided above the same. The bit line $\overline{BL1}$ is connected to the N+ diffusion layer 51 and the gate 201 through contacts 11 and 31 respectively. The bit line BL1 is connected to the N+ diffusion layer 61 and the gate 101 through contacts 21 and 41 respectively. The gates are formed by first polycrystalline silicon layers, and the bit lines are formed by second polycrystalline silicon layers provided above the same. The N+ diffusion layers 71 and 81 are connected to an aluminum interconnection layer 30 through a contact 91.

The sense amplifiers SA2, SA3 and SA4, which are connected with the bit lines BL2, $\overline{BL2}$, BL3, $\overline{BL3}$, BL4 and $\overline{BL4}$ respectively, are formed similarly to the above.

Noting the bit line BL2 in FIG. 7, this bit line BL2 extends orthogonally to gates 201, 103 and 104 forming the respective ones of the sense amplifiers SA1, SA3 and SA4, which are not connected with the bit line BL2. In other words, the direction of width of the gates forming each sense amplifier is orthogonal to the longitudinal direction of the bit lines. Thus, each of the N+ diffusion layers of the N-channel MOS transistors forming the sense amplifiers is shared. Thus, the area of the portion provided with the sense amplifiers can be reduced.

With reference to FIGS. 4 and 9, the planar structure of the sense amplifier arrangement according to the present invention, which is applied to the pseudo folded bit line structure, is now described. The sense amplifier SA1, which is connected with the bit lines BL1 and $\overline{BL1}$, includes N-channel MOS transistors Tr11 and Tr21. The transistor Tr11 is formed by N+ diffusion layers 51 and 71 for serving as source or drain regions and a gate 10 which is provided above the same. The transistor Tr21 is formed by N+ diffusion layers 61 and 81 for serving as source or drain regions and a gate 201 which is provided above the same. The bit line $\overline{BL1}$ is connected with the N+ diffusion layer 51 and an aluminum interconnection layer 31 through a contact 11. This aluminum interconnection layer 31 is connected with the gate 201 through a contact 31C. The bit line BL1 is connected to the N+ diffusion layer 61 and an aluminum interconnection layer 41 through a contact 21. The aluminum interconnection layer 41 is connected with a gate 101 through a contact 41C. The gates are formed by first polycrystalline silicon layers, and the bit lines are formed by second polycrystalline silicon layers provided above the same. The aluminum interconnection layers are provided above the second polycrystalline silicon layers. The N+ diffusion layers 71 and 81 are connected with an aluminum interconnection layer 30 through a contact 91.

The sense amplifiers SA2, SA3 and SA4, which are connected with respective ones of the bit lines BL2, $\overline{BL2}$, BL3, $\overline{BL3}$, BL4 and $\overline{BL4}$ are formed similarly to the above.

In the example shown in FIG. 9, gates 101, 102, 103 and 104 are arranged to intersect with the bit lines $\overline{BL1}$, $\overline{BL2}$, $\overline{BL3}$ and $\overline{BL4}$. Further, gates 201, 202, 203 and 204 are arranged to intersect with the bit lines BL1, BL2, BL3 and BL4. Thus, the bit lines extend orthogonally to the direction of width of the gates, so that N+ diffusion layers 71, 72, 81, 82, 73, 74, 83 and 84 forming the respective N-channel MOS transistors are shared. Thus, the sense amplifiers can be so arranged that the plane area occupied by the portion provided with the sense amplifiers is reduced.

Sectional structure of the sense amplifier arrangement shown in FIG. 9 is now described. FIG. 10 is a sectional view taken along the line X—X in FIG. 9, and FIG. 11 is a sectional view taken along the line XI—XI in FIG. 9. Referring to FIG. 10, a P-type silicon substrate 1 is provided with N diffusion layers 61, 81, 82, 62, 63, 83, 84 and 64 forming respective transistors with spaces. Gates 201, 202, 203 and 204, which are insulated by an insulating layer 5, are provided above the silicon substrate 1 with spaces. A contact hole 21 is provided in the insulating layer 5 to reach the surface of the N+ diffusion layer 61. A bit line $\overline{BL1}$ and an aluminum interconnection layer 41 are connected to the N+ diffusion layer 61 through the contact hole 21. Aluminum interconnection layers 30, 42, 43 and 44 are provided above the bit line $\overline{BL1}$ through the insulating layer 5.

Referring to FIG. 11, contact holes 14 and 24 are provided to reach the respective surfaces of the N+ diffusion layers 54 and 64 which are formed on the P-type silicon substrate 1. A bit line $\overline{BL4}$ and an aluminum interconnection layer 34 are connected to the N+ diffusion layer 54 through the contact 14, while a bit line BL4 and an aluminum interconnection layer 44 are connected with the N+ diffusion layer 64 through the contact 24 respectively. The aluminum interconnection layer 34 is connected to a gate 204 through a contact hole 34C.

Thus, the inventive sectional structure of the sense amplifiers can be easily attained by forming multilayer interconnection structure through the contact holes.

With increase in density of integration of a memory cell array, the bit line space must be reduced to 2.6 μm in a 4 megabit level or to 2.0 μm in a 16 megabit level, for example. In response to this, the gate length of each transistor included in each sense amplifier must be reduced to 1.8 μm in the 4 megabit level or to 1.2 μm in the 16 megabit level, for example, according to the conventional sense amplifier structure. In this case, the gate length can be limited by the layout of the overall semiconductor memory device. However, the gate length is preferably as long as possible. Assuming that ΔL represents an error in gate length L of the overall chip of a semiconductor memory device, dispersion in characteristics of the respective transistors is proportional to ΔL/L. Particularly in transistors forming sense amplifiers, such dispersion in characteristics must be minimized in consideration of the function of the sense amplifiers. Thus, it is desired to reduce the dispersion in characteristics of the transistors by maximizing the gate length of the transistors forming the sense amplifiers. According to the inventive structure of the sense amplifiers, the longitudinal direction of the gates of the transistors forming the sense amplifiers is along the longitudinal direction of the bit lines. In other words, the gates are so arranged that the direction of width thereof is across the longitudinal direction of the bit lines, whereby the gate length of the transistors forming the sense amplifiers can be maximized in order to reduce dispersion in characteristics, with no restriction caused by reduction in bit line space.

Although the above embodiments have been described with reference to N-channel sense amplifiers employing N-channel MOS transistors, the inventive sense amplifier arrangement is also applicable to P-channel sense amplifiers employing P-channel MOS transistors as well as to sense amplifiers including CMOS flip-flops formed by P-channel sense amplifiers and N-channel sense amplifiers.

Further, although four sense amplifiers are arranged along the longitudinal direction of the bit lines in each of the aforementioned embodiments, the number of the sense amplifiers arranged along the longitudinal direction of the bit lines is not restricted to four. Although FIGS. 5 to 9 show examples of concrete planar structure of the present invention which is applied to the bit line structure systems shown in FIGS. 1, 2 and 3 respectively, the planar structure is not restricted to those shown in the figures but the layout can be designed in various ways.

In addition to the DRAM, the present invention is also applicable to a static random access memory (SRAM), which is formed by sense amplifiers for sensing and amplifying voltage difference between bit line pairs. If the inventive sense amplifier arrangement is applied to the SRAM, the example shown in FIG. 2, which is applied to the folded bit line structure, is employable.

According to the present invention, as hereinabove described, the sense amplifiers can be arranged independently of the spaces between the bit lines, whereby the density of the memory cell array can be increased and a sense amplifier circuit responsive to desired characteristics of peripheral circuits which are connected to the sense amplifiers can be structured.

Further, the area of the portion provided with the sense amplifiers can be reduced by such arrangement that the direction of width of gates of field effect transistors forming the sense amplifiers is across the longitudinal direction of the bit lines.

Although the present invention has been described and illustrated in detail, it is clearly understood that the same is by way of illustration and example only and is not to be taken by way of limitation, the spirit and scope of the present invention being limited only by the terms of the appended claims

What is claimed is:

1. A semiconductor memory device comprising:
   a semiconductor substrate having a major surface;
   a plurality of bit line pairs and a plurality of word lines provided on said major surface of said semiconductor substrate and crossing each other, each said bit line pair being formed by a first bit line and a second bit line;
   a memory cell array region formed by a plurality of memory cells arranged on crossover points of said bit lines and said word lines; and
   a plurality of sense amplifier means, each connected to a corresponding bit line pair extending from said memory cell array region for sensing and amplifying voltage difference between said bit line pair, said plurality of sense amplifier means being arranged along the longitudinal direction of said bit line pairs,
   at least either said first bit line or said second bit line forming each said bit line pair connected to its corresponding sense amplifier means being arranged to cross but not intersect with a region occupied by at least one other sense amplifier means when said at least one other sense amplifier means is positioned between said memory cell array region and said corresponding sense amplifier means;

one of said plurality of sense amplifiers crossing with at least four bit lines.

2. A semiconductor memory device comprising:
a semiconductor substrate having a major surface;
a plurality of bit line pairs and a plurality of word lines provided on said major surface of said semiconductor substrate and crossing each other, each said bit line pair being formed by a first bit line and a second bit line;
a memory cell array region formed by a plurality of memory cells arranged on crossover points of said bit lines and said word lines; and
a plurality of sense amplifier means, each connected to a corresponding bit line pair extending from said memory cell array region for sensing and amplifying voltage differences between said bit line pair, at least three said sense amplifier means being arranged along the longitudinal direction of said bit line pairs,
at least either said first bit line or said second bit line forming each said bit line pair connected to its corresponding sense amplifier means being arranged to cross but not intersect with a region occupied by at least another sense amplifier means when said another sense amplifier means is positioned between said memory cell array region and said corresponding sense amplifier means.

3. A semiconductor memory device comprising:
a semiconductor substrate having a major surface;
a plurality of bit line pairs and a plurality of word lines provided on said major surface of said semiconductor substrate and crossing each other, each said bit line pair being formed by a first bit line and a second bit line;
a memory cell array region formed by a plurality of memory cells arranged on crossover points of said bit lines and said word lines; and
a plurality of sense amplifier means, each connected to a corresponding bit line pair extending from said memory cell array region for sensing and amplifying voltage difference between said bit line pair, said plurality of sense amplifier means being arranged along the longitudinal direction of said bit line pairs,
at least either said first bit line or said second bit line forming each said bit line pair connected to its corresponding sense amplifier means being arranged to cross but not intersect with a region occupied by at least one other sense amplifier means when said at least one other sense amplifier means is positioned between said memory cell array region and said corresponding sense amplifier means,
one of said plurality of sense amplifiers means crossing with at least three bit lines,
said sense amplifier means including field effect transistors so arranged that the direction of gate width, perpendicular to a channel direction between source and drain regions forming each said field effect transistor, is perpendicular to the longitudinal direction of said bit lines.

4. A semiconductor memory device comprising:
a semiconductor substrate having a major surface;
a plurality of bit line pairs and a plurality of word lines provided on said major surface of said semiconductor substrate and crossing each other, each said bit line pair being formed by a first bit line and a second bit line;
a memory cell array region formed by a plurality of memory cells arranged on crossover points of said bit lines and said word lines; and
a plurality of sense amplifier means, each connected to a corresponding bit line pair extending from said memory cell array region for sensing and amplifying voltage difference between said bit line pair, said plurality of sense amplifier means being arranged along the longitudinal direction of said bit line pairs,
at least either said first bit line or said second bit line forming each said bit line pair connected to its corresponding sense amplifier means being arranged to cross but not intersect with a region occupied by at least one other sense amplifier means when said at least one other sense amplifier means is positioned between said memory cell array region and said corresponding sense amplifier means;
wherein the length of each said sense amplifier in a direction perpendicular to the longitudinal direction of said bit lines is greater than four times the distance between adjacent bit lines.

5. The device of claim 4, wherein each said sense amplifier means includes first and second transistors, the first transistor of one said sense amplifier means and the second transistor of another said sense amplifier means being formed by a common diffusion region.

6. A semiconductor memory device comprising:
a semiconductor substrate having a major surface;
a plurality of bit line pairs and a plurality of word lines provided on said major surface of said semiconductor substrate and crossing each other, each said bit line pair being formed by a first bit line and a second bit line;
a memory cell array region formed by a plurality of memory cells arranged on crossover points of said bit lines and said word lines; and
a plurality of sense amplifier means, each connected to a corresponding bit line pair extending from said memory cell array region for sensing and amplifying voltage difference between said bit line pair, said plurality of sense amplifier means being arranged along the longitudinal direction of said bit line pairs,
at least either said first bit line or said second bit line forming each said bit line pair connected to its corresponding sense amplifier means being arranged to cross but not intersect with a region occupied by at least one other sense amplifier means when said at least one other sense amplifier means is positioned between said memory cell array region and said corresponding sense amplifier means,
wherein the length of each said sense amplifier means in a direction perpendicular to the longitudinal direction of said bit lines is greater than four times the distance between adjacent bit lines, and
wherein the position each of said sense amplifier means with respect to all others of said sense amplifier means is staggered transversely to the longitudinal direction of said bit lines.

7. A structure for an arrangement of sense amplifier means and bit lines in a semiconductor memory device, comprising:

bit line pairs each formed by a first bit line and a second bit line on a main surface of a semiconductor substrate;

a plurality of sense amplifier means each connected to a corresponding bit line pair for sensing and amplifying voltage differences between bit lines of said corresponding bit line pair;

each of said sense amplifier means including a first field effect transistor and a second field effect transistor;

said first field effect transistor having a first gate electrode and two first impurity regions formed spaced apart from each other in a channel direction by said first gate electrode;

said second field effect transistor having a first gate electrode and two second impurity regions formed spaced apart from each other in a channel direction by the second gate electrode;

at least one of said first and second bit lines of said corresponding bit line pair being connected to at least one of said first and second gate electrodes; and at least one of said first and second gate electrodes of each said sense amplifier means having a gate width, perpendicular to said channel direction, extending through regions occupied by a plurality of bit line pairs.

8. A semiconductor memory device in accordance with claim 1, wherein said sense amplifier means include field effect transistors, said field effect transistors having source and drain diffusions spaced apart from each other along a channel direction and being so arranged that the direction of gate width, perpendicular to the channel direction, is perpendicular to the longitudinal direction of said bit lines.

9. A semiconductor memory device in accordance with claim 1, wherein each said bit line pair includes said first bit line extending from a first side of each said sense amplifier means and said second bit line extending from a second side of each said sense amplifier means.

10. A semiconductor memory device in accordance with claim 1, wherein each said bit line pair includes said first bit line and said second bit line extending from a first side of each said sense amplifier means.

11. A semiconductor memory device in accordance with claim 10, wherein said first bit line and said second bit line extend in the same direction at regular intervals.

12. A semiconductor memory device in accordance with claim 10, wherein said first bit line and said second bit line closely adjacent each other and extend in the same direction.

13. A semiconductor memory device in accordance with claim 10, wherein said first bit lines and said second bit lines are alternately arranged to form a plurality of said bit line pairs.

14. A semiconductor memory device in accordance with claim 10, wherein a first bit line group formed by a given number of said first bit lines and a second bit line group formed by the same number of said second bit lines are alternately arranged to provide a plurality of said bit line pairs.

15. A semiconductor memory device in accordance with claim 14, wherein said sense amplifier means are arranged along the longitudinal direction of said bit line pairs corresponding to the number of said bit line pairs formed by said first bit line group and said second bit line group.

16. A semiconductor memory device in accordance with claim 2, wherein at least said first bit line or said second bit line forming each said bit line pair connected to a corresponding sense amplifier means thereof is adapted to connect to said gates forming said field effect transistors included in said corresponding sense amplifier means.

17. A semiconductor memory device in accordance with claim 8, wherein at least said first bit line or said second bit line forming each said bit line pair connected to a corresponding sense amplifier means thereof is adapted to cross a region occupied by forming field effect transistors included in at least another sense amplifier means when said another sense amplifier means is positioned between said memory cell array region and said corresponding sense amplifier means.

18. A semiconductor memory device in accordance with claim 1, wherein said memory cells include dynamic type memory cells.

* * * * *